United States Patent [19]
Fluhrer

[11] Patent Number: 6,107,807
[45] Date of Patent: Aug. 22, 2000

[54] METHOD AND CIRCUIT FOR LOCATING A SHORT CIRCUIT OR CABLE BREAK IN A BUS SYSTEM

[75] Inventor: Sven Fluhrer, Goeppingen, Germany

[73] Assignee: DaimlerChrysler AG, Stuttgart, Germany

[21] Appl. No.: 09/102,775

[22] Filed: Jun. 23, 1998

[30] Foreign Application Priority Data

Jun. 23, 1997 [DE] Germany .......................... 197 26 539

[51] Int. Cl.$^7$ ................................................. G01R 31/11
[52] U.S. Cl. .......................... 324/533; 324/512; 324/527; 324/532
[58] Field of Search .................................. 324/533, 511, 324/607, 642, 534, 535, 512, 527, 532

[56] References Cited

U.S. PATENT DOCUMENTS

| 3,727,128 | 4/1973 | McFerrin | 324/533 |
| 4,144,487 | 3/1979 | Pharney | 324/533 |
| 4,151,459 | 4/1979 | Fayolle et al. | 324/533 |
| 4,165,482 | 8/1979 | Gale | 324/533 |
| 4,491,782 | 1/1985 | Bellis et al. | 324/533 |
| 5,184,081 | 2/1993 | Oswald et al. | 324/533 |

FOREIGN PATENT DOCUMENTS 37 12 780   10/1987   Germany .
42 12 742   10/1993   Germany .

OTHER PUBLICATIONS

DE–Z: ntz, vol. 49 (1994), vol. 4, pp. 242–246 entitled "Echomesstechnik macht LAN transparent" by Otto Knutz (no months available).

Primary Examiner—Glenn W. Brown
Assistant Examiner—Anjan K Deb
Attorney, Agent, or Firm—Evenson, McKeown, Edwards & Lenahan, P.L.L.C.

[57] ABSTRACT

A method for pinpointing a short circuit or cable break in a two-wire bus system has the two-wire bus system being subjected at at least one point to a pulse of such a steepness that a reflection occurs at the location of the short circuit and/or cable break. The short circuit or cable break is pinpointed on the basis of the propagation time of the pulse. A circuit includes a pulse generator connected with a gate chain with a shift register, so that the passage of the signal through the gate chain is launched when a pulse is injected into the two-wire bus system. The distance of the short circuit or cable break from the point at which the pulse generator is connected to the two-wire bus system is determined from the number of gates traversed. In addition, a method for pinpointing a cable break, determines that a cable break in the connecting leads of a subscriber has occurred if this subscriber cannot be reached by communication over the bus.

3 Claims, 2 Drawing Sheets

```
BUS NOT IN ORDER
DEFECT 5
LOW-LEAD SHORT CIRCUIT TO GROUND
DISTANCE 6m
```
TESTER
TESTER CONNECTED DIRECTLY TO SG 2
FIG. 2
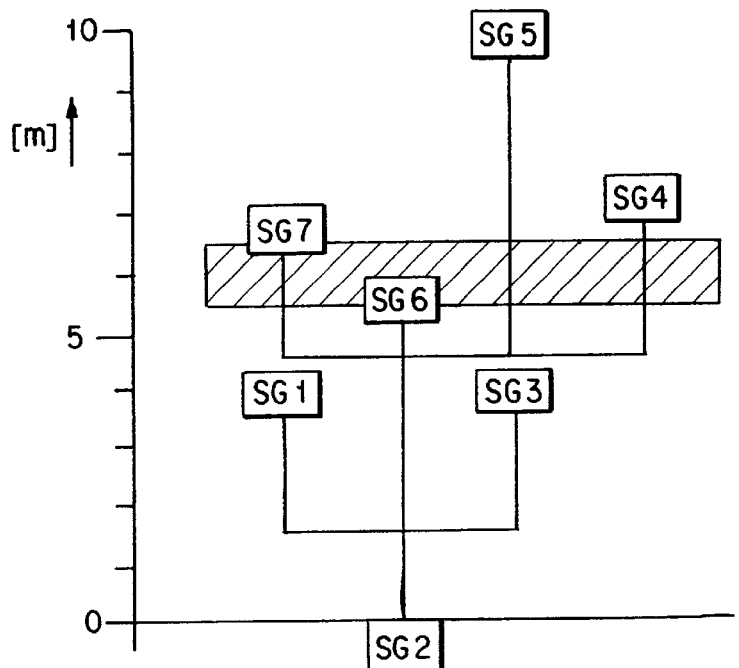
FIG. 3
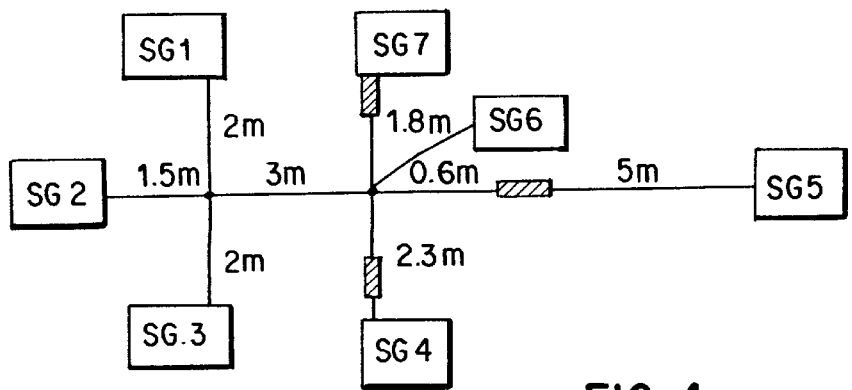
FIG. 4

METHOD AND CIRCUIT FOR LOCATING A SHORT CIRCUIT OR CABLE BREAK IN A BUS SYSTEM

BACKGROUND AND SUMMARY OF THE INVENTION

This application claims the priority of German Application No. 197 26 539.1, filed Jun. 23, 1997, the disclosure of which is expressly incorporated by reference herein.

The present invention relates to a method and a circuit for locating a short circuit or cable break in a bus system, with the short circuit or cable break in the bus system being pinpointed. The bus system is subjected at at least one point to a pulse with a steepness such that a reflection occurs at the point of the short circuit and/or cable break. The short circuit or cable break is pinpointed on the basis of the propagation time of the pulse.

In addition, a method is already known by which, under certain circumstances, a short circuit of one or both leads of a two-wire bus system to ground, or to the on-board system potential, can be detected. Also, a cable break in one or both leads can be detected (see German Patent document DE 42 12 742 A1). In this method, the voltage level on the two bus wires is compared with certain threshold values. As a function of various defects, various pairs of voltage levels are produced that are supposed to occur on the two bus wires. Therefore, the nature of the defect can be determined from an evaluation of the voltage levels.

According to the invention, it is known from DE-Z: ntz, Vol. 49 (1994), Volume 4, pp. 242–246 to determine the length of a lead and/or to locate a defect in a bus system by measuring the propagation time of a reflected signal injected at one end of the lead of the bus system.

The same is also known from German Patent document DE 37 12 780 A1, in which the propagation time is measured by a pulse being emitted again at a certain time following the reception of the reflected signal. The frequency of the pulses is measured and the propagation time can be determined from this. Pulses with alternating signs are produced.

From U.S. Pat. No. 4,151,459, in conjunction with a search for defects in a ski lift cable, it is known to measure the propagation time of a signal that is injected into the ski lift cable. The propagation time is measured using a shift register.

The distance of the short circuit and/or of the cable break from the point where the pulse is injected into the bus system can be determined by this method. Once the system topology is known, the location of the defect can be pinpointed using this method.

On the other hand, the goal of the present invention is to improve the process of pinpointing a detected defect.

This goal is achieved according to the invention by a method in which the bus system is a two-wire bus system which is subjected to a positive pulse when a short circuit to ground is detected and is subjected to a negative pulse when a short circuit to system potential is detected.

The choice of pulses determines the reflection of the pulse that is necessary for evaluation. From the previous error analysis it is known whether a short circuit to ground or to system potential is involved, so that the sign of the pulse can be selected as a function of this evaluation. The previous error analysis can proceed for example by the method described at the outset or by the method described in the application of Applicant on the same application date that is pending under File Number 197 26 538.3 at the German Patent Office (corresponding to U.S. Ser. No. 09/102,629, filed on even date herewith and entitled "Method and Circuit for Checking Lead Defects in a Two-Wire Bus System", the specification of which is expressly incorporated by reference herein).

In the method according to the invention, the pulse is at least approximately a pulse function.

As a result, first of all, a sufficiently high slope of the pulse is achieved so that a reflection occurs. On the other hand, assurance is provided that the energy content of the pulse is limited to a finite value, so that errors caused by checking can be avoided.

In the circuit according to the present invention for performing one of the above methods, a pulse generator is connected with a chain of logic gates having a shift register, with the passage of the signal through the gate chain being started when a pulse is emitted into the two-wire bus system, whereupon the reflected signal interrupts the passage of the signal through the gate chain, so that the distance of the short circuit or cable break from the point where the pulse generator is connected to the two-wire bus system can be determined from the number of gates that have been traversed, with the pulse generator transmitting a positive pulse when a short circuit to ground is detected, and a negative pulse when a short circuit to system potential is detected.

The method according to the invention can be performed comparatively simply with this circuit.

In a method for locating a cable break according to the invention, a cable break is determined to have taken place in the connecting leads of a subscriber when this subscriber cannot be reached by communication over the bus.

As a result, this defect can also be detected, while otherwise this defect cannot be detected by continuous communication.

Other objects, advantages and novel features of the present invention will become apparent from the following detailed description of the invention when considered in conjunction with the accompanying drawings.

BRIEF DESCRIPTION OF THE DRAWINGS

FIG. 2 constitutes a diagram of how the defect is indicated:

FIG. 3 constitutes a schematic diagram of how the defect can be generally pinpointed with knowledge of the bus topology; and FIG. 4 constitutes a schematic diagram of how the defect can be specifically pinpointed with knowledge of the bus topology.

DETAILED DESCRIPTION OF THE DRAWINGS

Figure 1:
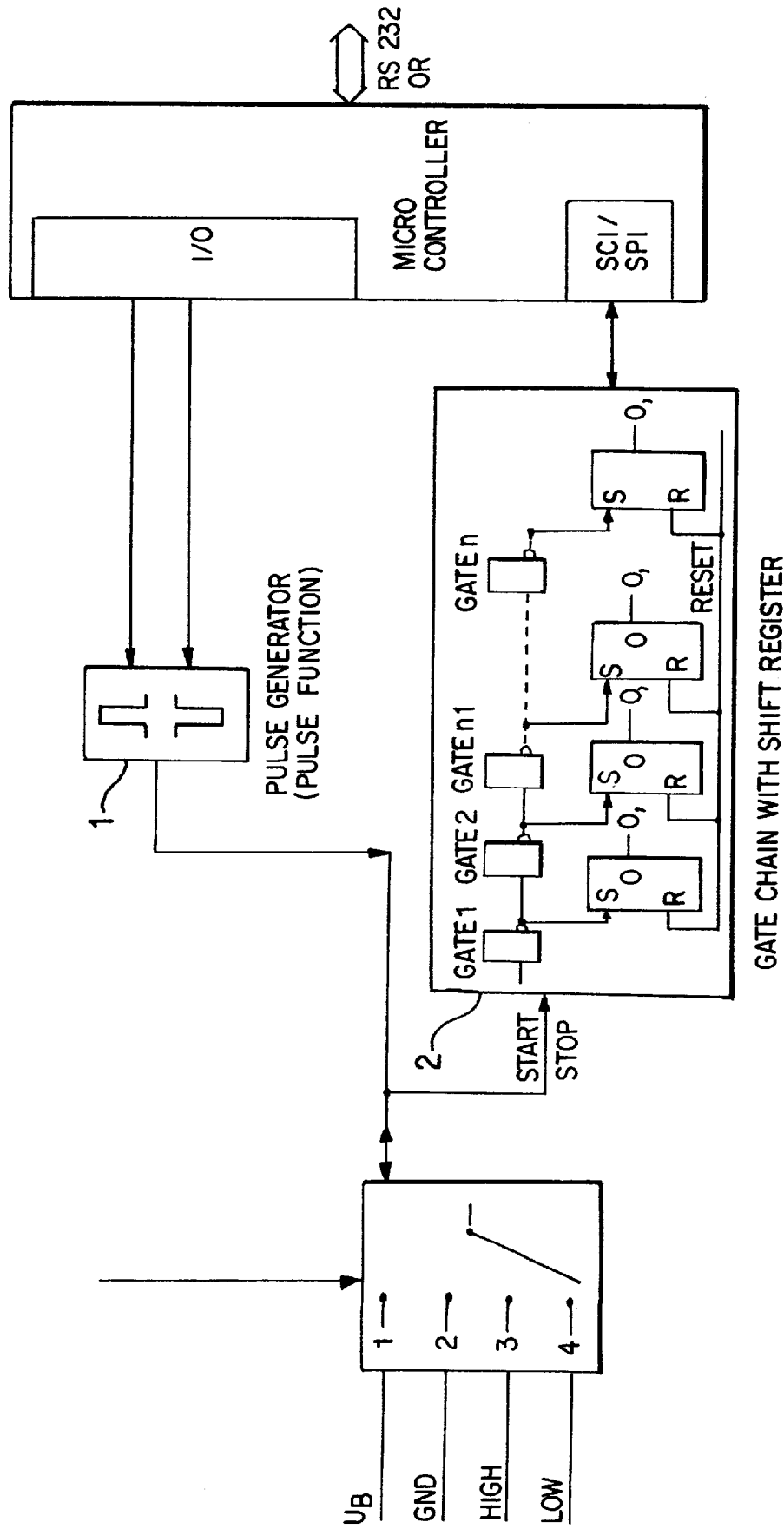
FIG. 1 is a schematic embodiment of a display for the circuit.

In general, short circuits and cable break defects can be divided essentially into two groups:
1. Short circuit to an on-board system voltage, and
2. Short circuit to ground or to one another and/or a cable break.

It is critical for the measurement that a negative pulse is required for the first group and a positive pulse for the second group. The principle of lead reflection assumes a suitably high slope (pulse function).

Depending on the nature of the defect found, the relevant lead is connected with the propagation time determination circuit. For this purpose, referring to FIG. 1, a pulse function is imposed on one of the relevant leads by pulse generator 1 (high or low lead). At the same time, a gate chain 2 is triggered as a result and the shift register test is launched. The pulse is reflected at the location of the defect in the system and returns along the same lead. This reflected pulse stops the passage of the signal through the gate chain, with the number of flip-flops that have been set (shift register) being equal to the number of gates traversed. In this way, the number of flip-flops set, multiplied by the propagation time of a gate, is the total propagation time of the pulse in the defective lead. This time value divided by two corresponds to the distance between the location of the defect and the testing device. If the signal propagation time in a lead is assumed to be 5 ns per meter and gates are used whose propagation time is 2.5 ns for example, the location of the defect can be pinpointed with a resolution on the order of 0.5 m. This resolution is due to the fact that during the period between two passages through the gates, it is not possible to state whether a passage through a gate has just ended or whether the next passage through a gate is imminent. This produces an error on the order of one passage through a gate, in other words 2.5 ns. As a result, with the assumed signal propagation time in the lead of 5 ns per meter, a pinpointing accuracy of 0.5 m is the result. In general, pinpointing accuracy decreases directly with gate propagation time. For example, if gates with a propagation time of 0.4 ns are used, the result is a theoretical pinpointing error of 8 cm.

With a knowledge of the respective system topology and with a need for several measurements at different locations in the system to pinpoint the defect, the possible location of the defect can be limited to one or two points in the system.

To locate a double wire break, in addition to the corresponding protocol module, a knowledge of the set and actual configurations of the system is required. If a particular system node is never detected although it is in fact intended to be part of the system, there must be a cable break and thus this system node can be pinpointed unambiguously. In this case, there is a defect in the branch to this control device. The double cable break can also be pinpointed as described above by using the reflection method.

FIGS. 2 to 4 show how a defect in the system can be pinpointed by using the distance of a defect from a test point.

FIG. 2 shows a possible display with an error message from the testing device. A possible defect location can be pinpointed on the basis of the distance information for example in a graph like that in FIG. 3. The input of the pulse of FIG. 3 is at the location of control device 2 (SG2). Utilizing the distance of 6 meters from the tester of FIG. 2 for the location of the short circuit to ground, it can be seen in FIG. 3, that the location of the short circuit could be in the vicinity of control device SG7, control device SG6 or on the leads for the control device SG5 or control device SG4. In a next step, in accordance with the drawing shown in FIG. 4, the possible defect location can be pinpointed even more closely when a transition is made to the exact system topology. For example, the defect location can be determined unambiguously by performing one or more additional measurements at further locations. The cross hatched areas in FIG. 4 provide 3 possible rather specific locations for the low-lead short circuit to ground.

The system diagram can be output for example by a printer in paper form or can be displayed on the display or screen of a computer.

According to the invention therefore, considerable expense in locating a defect can be avoided by pinpointing the location of a short circuit, which is the most frequent type of defect.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for locating a short circuit in a bus system, the method comprising the acts of:
    determining whether said short circuit is a short circuit to ground or a short circuit to a system potential;
    subjecting at least one point of the bus system to a pulse having a slope which is sufficient to cause a reflection at the location of the short circuit; and
    pinpointing the short circuit on the basis of the propagation time of the pulse, wherein said act of pinpointing the short circuit includes the acts of subjecting a propagation circuit to said pulse simultaneous with the subjecting of said at least one point of the bus system to said pulse and determining the propagation time of said pulse through said propagation circuit until said reflection stops propagation through said propagation circuit, wherein said bus system is a two-wire bus system subjected to a positive pulse when a short circuit to ground is determined and is subjected to a negative pulse when a short circuit to the system potential is determined.

2. The method according to claim 1, wherein the pulse is substantially an impulse function.

3. A circuit for locating a short circuit in a two-wire bus system, wherein said short circuit has been previously determined as to whether it is a short circuit to ground or a short circuit to system potential, the circuit comprising:
    a pulse generator;
    a gate chain having a shift register, said gate chain being connected with said pulse generator;
    means for connecting an output of said pulse generator simultaneously through said gate chain and said two-wire bus system wherein a reflected signal from said short circuit in said two-wire bus system provides an interruption in the passage of the output of the pulse generator through said gate chain; and
    wherein a distance of the short circuit from a point at which the pulse generator is connected to the two-wire bus system is determined based on a number of gates traversed by the output of said pulse generator in said gate chain before said interruption by said reflected signal, with a positive pulse being emitted by said pulse generator when a short circuit to ground was previously detected and a negative pulse being emitted when a short circuit to a system potential was previously detected.

* * * * *